United States Patent
Lee et al.

(10) Patent No.: US 11,263,075 B2
(45) Date of Patent: Mar. 1, 2022

(54) MEMORY SYSTEM AND OPERATING METHOD THEREOF

(71) Applicant: SK hynix Inc., Icheon-si (KR)

(72) Inventors: Hee Youl Lee, Icheon-si (KR); Dong Kyu Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/508,951

(22) Filed: Jul. 11, 2019

(65) Prior Publication Data

US 2020/0183776 A1 Jun. 11, 2020

(30) Foreign Application Priority Data

Dec. 7, 2018 (KR) .......................... 10-2018-0157460

(51) Int. Cl.
*G06F 11/08* (2006.01)
*G11C 16/08* (2006.01)
*G11C 16/26* (2006.01)

(52) U.S. Cl.
CPC .............. *G06F 11/08* (2013.01); *G11C 16/08* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 9,411,679 | B2* | 8/2016 | Seol | G06F 11/1008 |
| 9,710,328 | B2* | 7/2017 | Lee | G06F 11/1072 |
| 2013/0024743 | A1* | 1/2013 | Sharon | G06F 11/1068 |
| | | | | 714/763 |
| 2014/0043903 | A1* | 2/2014 | Ok | G11C 29/028 |
| | | | | 365/185.03 |

FOREIGN PATENT DOCUMENTS

KR 1020130130485 A 12/2013
KR 1020160073834 A 6/2016

* cited by examiner

*Primary Examiner* — April Y Blair
*Assistant Examiner* — Matthew W Wahlin
(74) *Attorney, Agent, or Firm* — William Park & Associates Ltd.

(57) ABSTRACT

Disclosed is a memory system and a method of operating the memory system. The memory system includes a semiconductor memory device configured to read data stored in a selected logical page among a plurality of logical pages by applying different read voltages to a selected word line corresponding to the plurality of logical pages. The memory system also includes a controller configured to perform an operation for detecting and correcting an error of the data whenever each of the read voltages is applied to the selected word line.

6 Claims, 11 Drawing Sheets

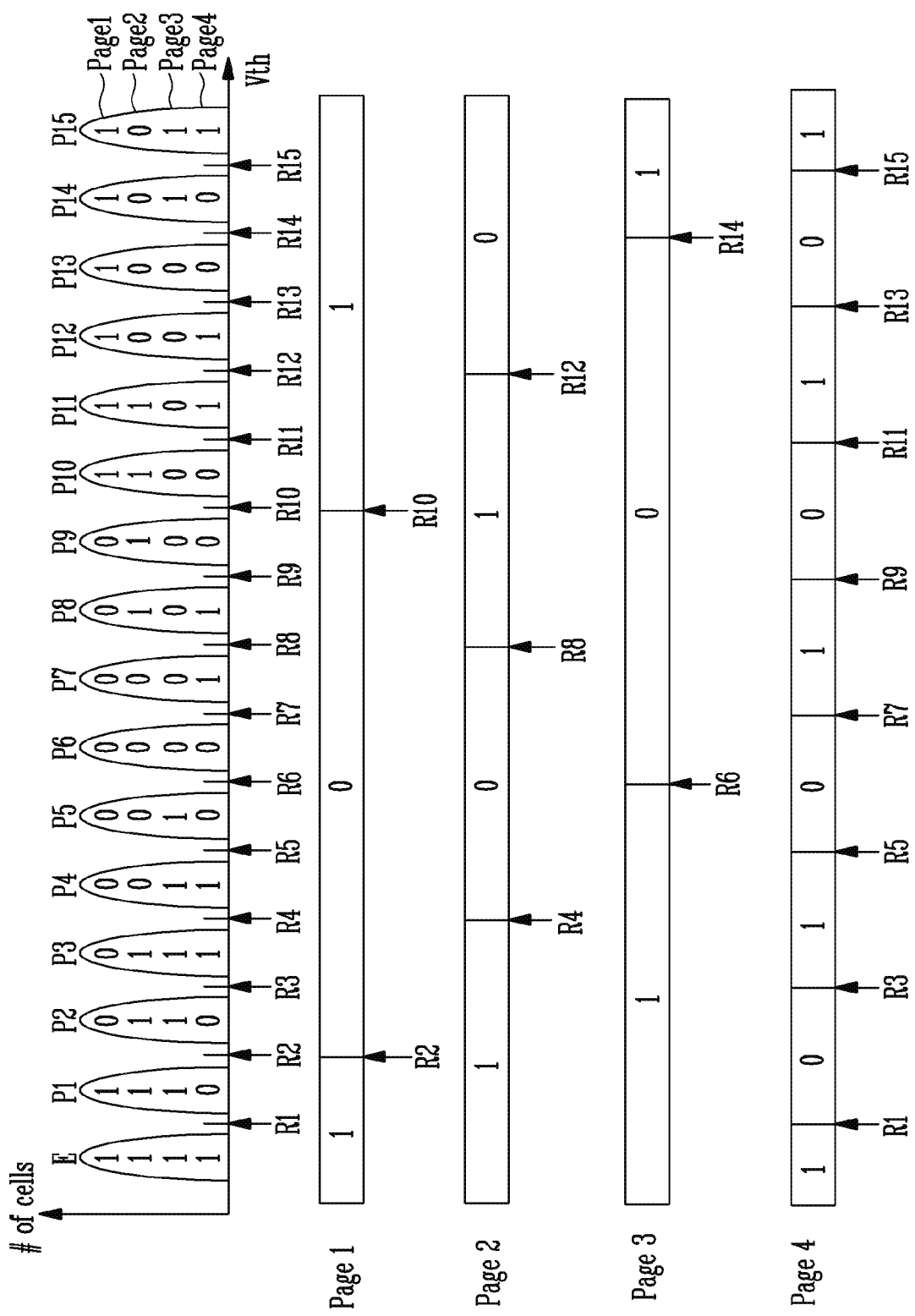

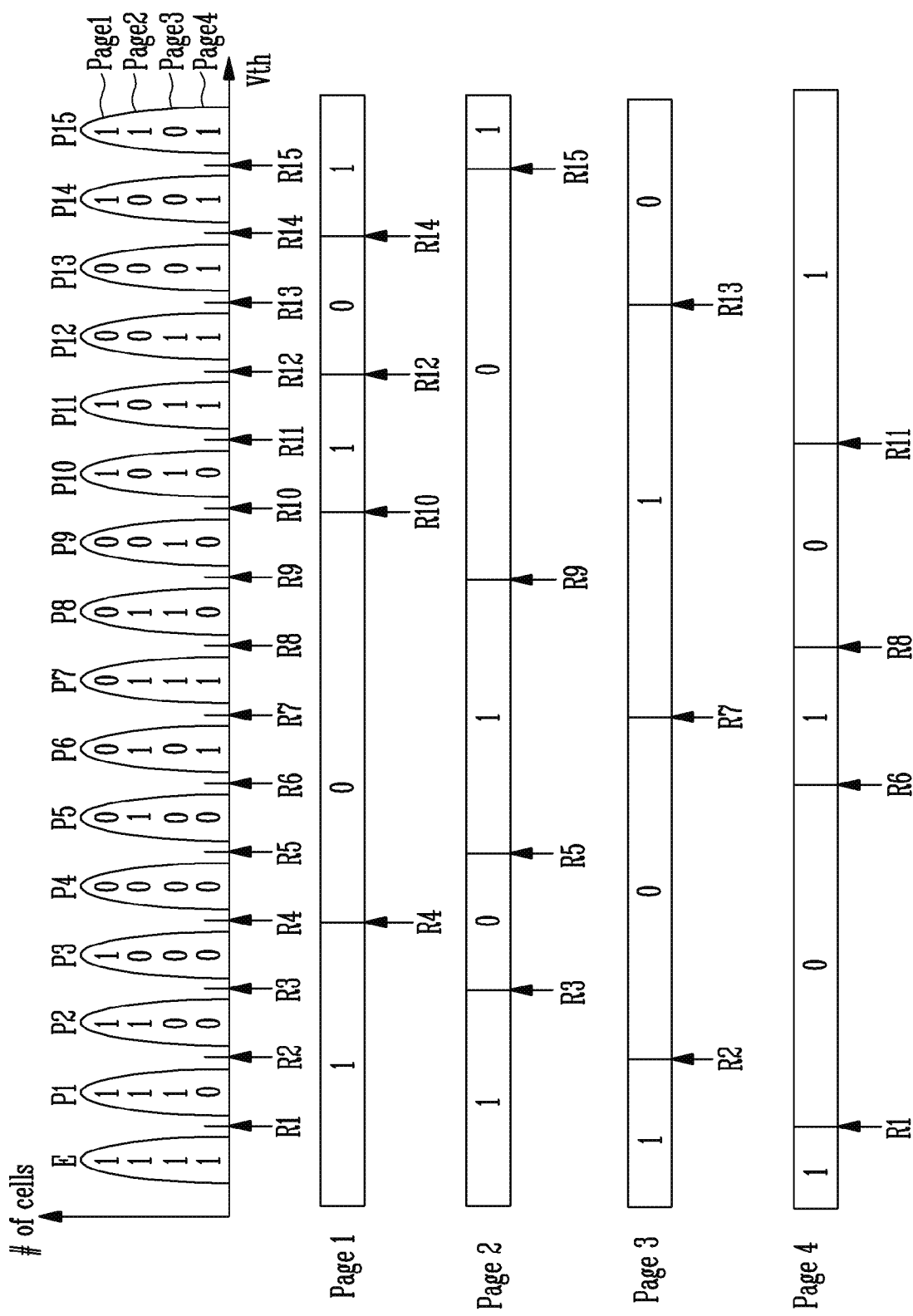

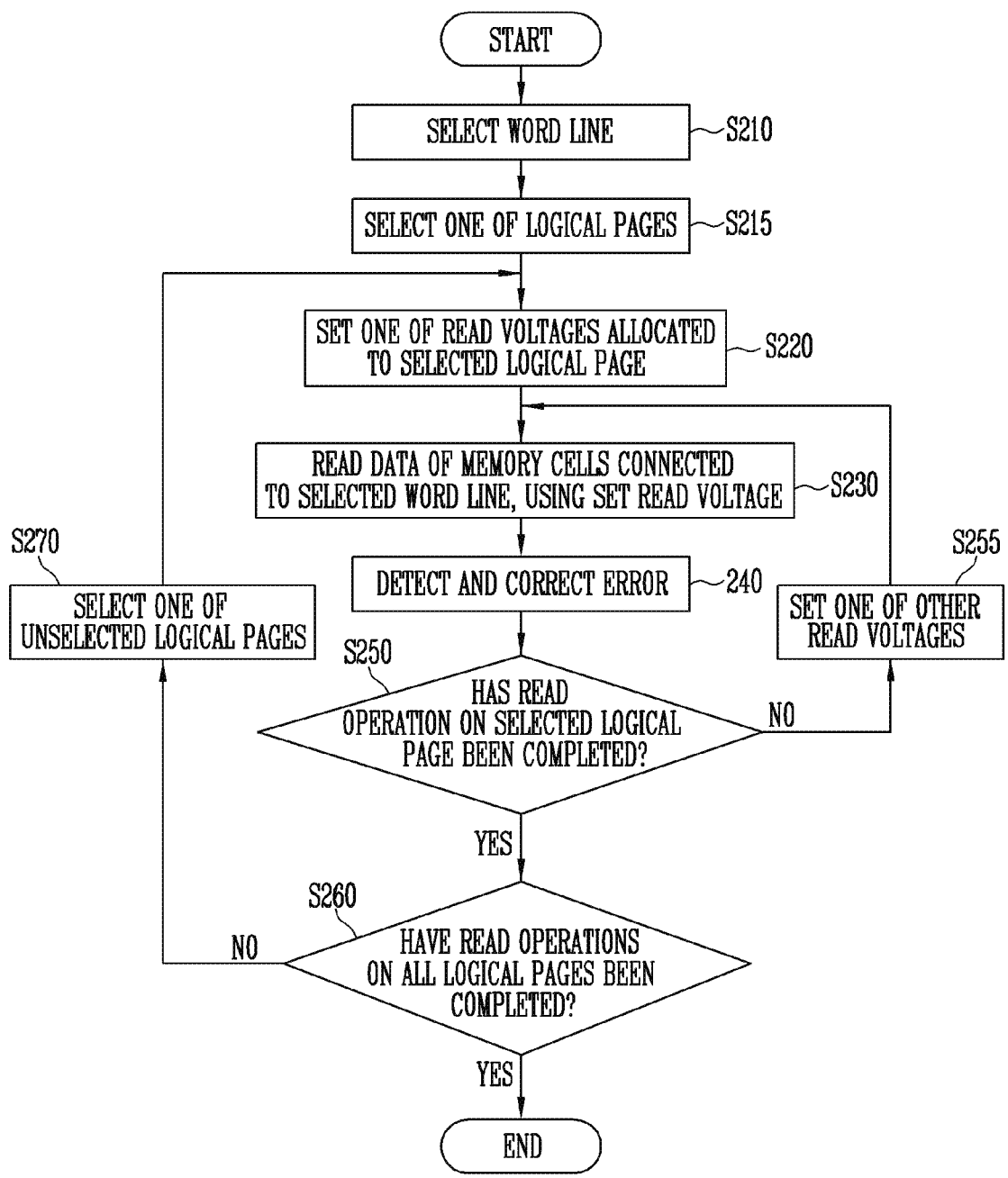

MEMORY SYSTEM AND OPERATING METHOD THEREOF

CROSS-REFERENCE TO RELATED APPLICATION

The present application claims priority under 35 U.S.C. § 119(a) to Korean patent application 10-2018-0157460 filed on Dec. 7, 2018, in the Korean Intellectual Property Office, the entire disclosure of which is incorporated herein by reference.

BACKGROUND

1. Technical Field

The present disclosure generally relates to a memory system, and more particularly, to a memory system for processing data into a memory device and an operating method of the memory system.

2. Related Art

An electronic device, such as a computer, a digital camera, or a smart phone, uses a memory system for processing data. The memory system may include a memory device for storing data and a controller for controlling the memory device. The memory system may detect and correct an error in data read from the memory device through an error correction code calculation.

The memory device may be classified as a volatile memory device or a nonvolatile memory device. The nonvolatile memory device is a memory device that retains stored data even when the supply of power is interrupted.

The nonvolatile memory device may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

The nonvolatile memory device may include multi-level cells for storing multi-bit data. Bits stored in each of the multi-bit cells form a plurality of logical pages. In general, error correction on multi-level cells is performed in units of logical pages. Although the same error correction capability is provided to logical pages, different error occurrence probabilities may be associated with the logical pages. Accordingly, error correction efficiency is decreased.

SUMMARY

According to an aspect of the present disclosure, a memory system includes a semiconductor memory device and controller. The semiconductor memory device is configured to read data stored in a selected logical page among a plurality of logical pages by applying different read voltages to a selected word line corresponding to the selected logical pages. The controller is configured to perform an operation for detecting and correcting an error of the data whenever each of the read voltages is applied to the selected word line.

According to another aspect of the present disclosure, a method for operating a memory system includes selecting one of a plurality of word lines and performing read operations on the selected word line using a plurality of read voltages. The method further includes performing an operation for detecting and correcting an error of data stored in memory cells connected to the selected word line with respect to each of the read operations.

According to still another aspect of the present disclosure, a method for operating a memory system includes selecting a word line connected to memory cells in which data are stored in a plurality of logical pages. The method also includes selecting one of the plurality of logical pages and performing read operations on the selected logical page using a plurality of read voltages. The method further includes detecting and correcting an error of the data stored in the memory cells for each of the read operations on the selected logical page.

BRIEF DESCRIPTION OF THE DRAWINGS

Example embodiments are described hereinafter with reference to the accompanying drawings; however, they may be embodied in different forms and should not be construed as limited to the embodiments set forth herein. Rather, presented embodiments are provided so that this disclosure will be enabling to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 5A and 5B are diagrams illustrating a page-based reading method.

FIGS. 6 and 7 are flowcharts illustrating operating methods of a memory system, according to embodiments of the present disclosure.

DETAILED DESCRIPTION

Figure 1:
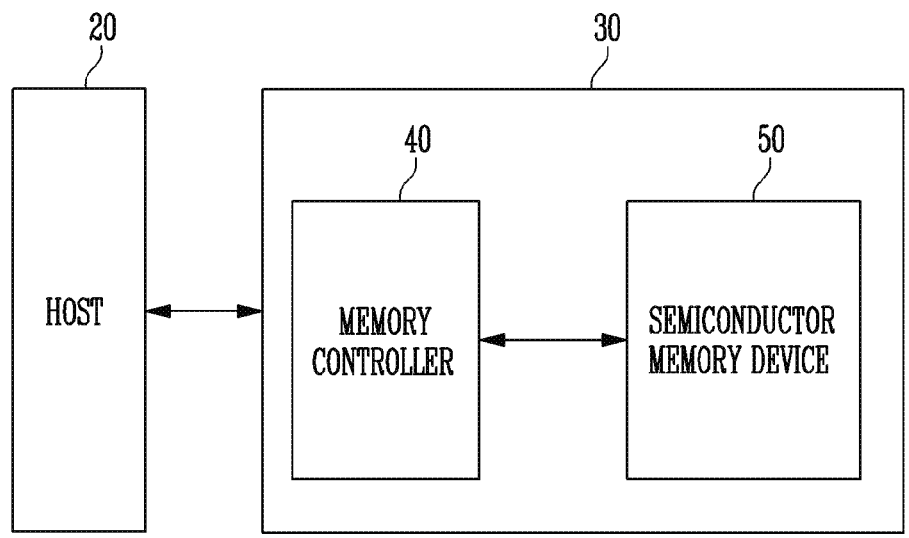
FIG. 1 is a block diagram illustrating a data processing system, according to an embodiment of the present disclosure.

Embodiments of the present disclosure can be variously modified and have various shapes. Embodiments illustrated in the drawings are described herein in detail. However, presented embodiments are not construed as being limited in that they include all changes, equivalents, and substitutions that do not depart from the spirit and technical scope of the claims set forth herein.

While terms such as "first" and "second" may be used to describe various components, such components are not limited by the terms. The terms are used only to distinguish one component from another. For example, a first component may be referred to as a second component without departing from the scope of the present disclosure, and likewise a second component may be referred to as a first component.

Various embodiments provide a memory system capable of improving error correction efficiency and an operating method of the memory system.

FIG. 1 is a block diagram illustrating a data processing system 10, according to an embodiment of the present disclosure.

Referring to FIG. 1, the data processing system 10 includes a host 20 and a memory system 30.

The host 20 may communicate with the memory system 30 through at least one of various interface protocols. The interface protocol may be a protocol such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small Computer Small Interface (SCSI) protocol, a serial Attached SCSI (SAS) protocol, a Universal Serial Bus (USB) protocol, a Multi-Media Card (MMC) protocol, an Enhanced Small Disk Interface (ESDI) protocol, or an Integrated Drive Electronics (IDE) protocol.

The memory system 30 includes a memory controller 40 and a semiconductor memory device 50.

The memory controller 40 controls overall operations of the memory system 30 and controls data exchange between the host 20 and the semiconductor memory device 50. For example, the memory controller 40 may control a program operation, an erase operation, a read operation, etc. of the semiconductor memory device 50 according to a request from the host 20. For example, the memory controller 40 generates a command and an address, which correspond to a request received from the host 20, and provides the command and the address to the semiconductor memory device 50.

The semiconductor memory device 50 may include a nonvolatile memory device capable of retaining stored data even when power is not supplied. In an example, the semiconductor memory device 50 may be a NAND flash memory. The semiconductor memory device 50 performs a program operation, an erase operation, a read operation, etc. in response to the command and the address, which are provided by the memory controller 40.

The memory system 30 may perform an operation for detecting and correcting an error of data stored in the semiconductor memory device 50 whenever read voltages for a plurality of different read operations are applied. The operation for detecting and correcting the error may be performed in the semiconductor memory device 50 under the control of the memory controller 40.

Figure 2:
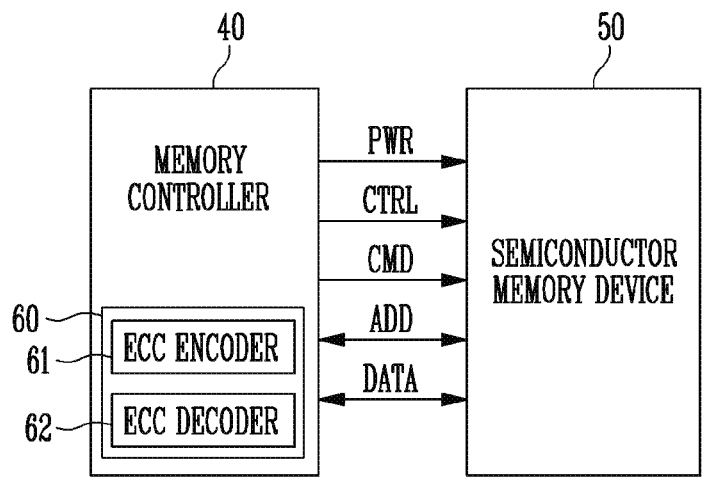
FIG. 2 is a block diagram illustrating a memory system, according to an embodiment of the present disclosure.

FIG. 2 is a block diagram illustrating the memory system 30, according to another embodiment of the present disclosure.

Referring to FIG. 2, the semiconductor memory device 50 may perform a program operation, an erase operation, a read operation, etc. under the control of the memory controller 40. To this end, the semiconductor memory device 50 may receive a command CMD and an address ADD from the memory controller 40 through input/output lines. The semiconductor memory device 50 may exchange data DATA with the memory controller 40 through the input/output lines. Also, the semiconductor memory device 50 may be supplied with power PWR from the memory controller 40 through a power line and may receive a control signal CTRL from the memory controller 40 through a control line. The control signal CTRL may include a command latch enable signal, an address latch enable signal, a chip enable signal, a program enable signal, a read enable signal, and the like.

The memory controller 40 may include an Error Correction Code (ECC) circuit 60 for correcting an error bit. The ECC circuit 60 includes an ECC encoder 61 and an ECC decoder 62.

The ECC encoder 61 generates data to which a parity bit is added by performing ECC encoding on data to be programmed to the semiconductor memory device 50. The parity bit may be stored in the semiconductor memory device 50.

The ECC decoder 62 performs ECC decoding on data read from the semiconductor memory device 50. The ECC decoder 62 determines whether the ECC decoding has succeeded and outputs an instruction signal based on the determination result. The ECC decoder 62 may correct an error bit of the data using the parity bit generated in the ECC encoding.

The ECC circuit 60 has an error correction capability of a certain level. That is, the ECC circuit 60 may detect and correct error bits within the error correction capability. When the number of error bits exceeds the threshold number of correctable error bits, the ECC circuit 60 cannot correct the error bits. Therefore, an error correction fail signal is generated.

The ECC circuit 60 may perform error correction by using coded modulation including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation (BCM), etc. The error correction of the ECC circuit 60 is not limited to these coded modulation schemes and may employ other methods of error correction in different embodiments.

The ECC circuit 60 performs error bit detection and correction whenever a plurality of read voltages of different levels, which are used to read respective logical pages, are applied. That is, the ECC circuit 60 performs error bit detection and correction in a read voltage application unit with respect to one logical page.

Figure 3:
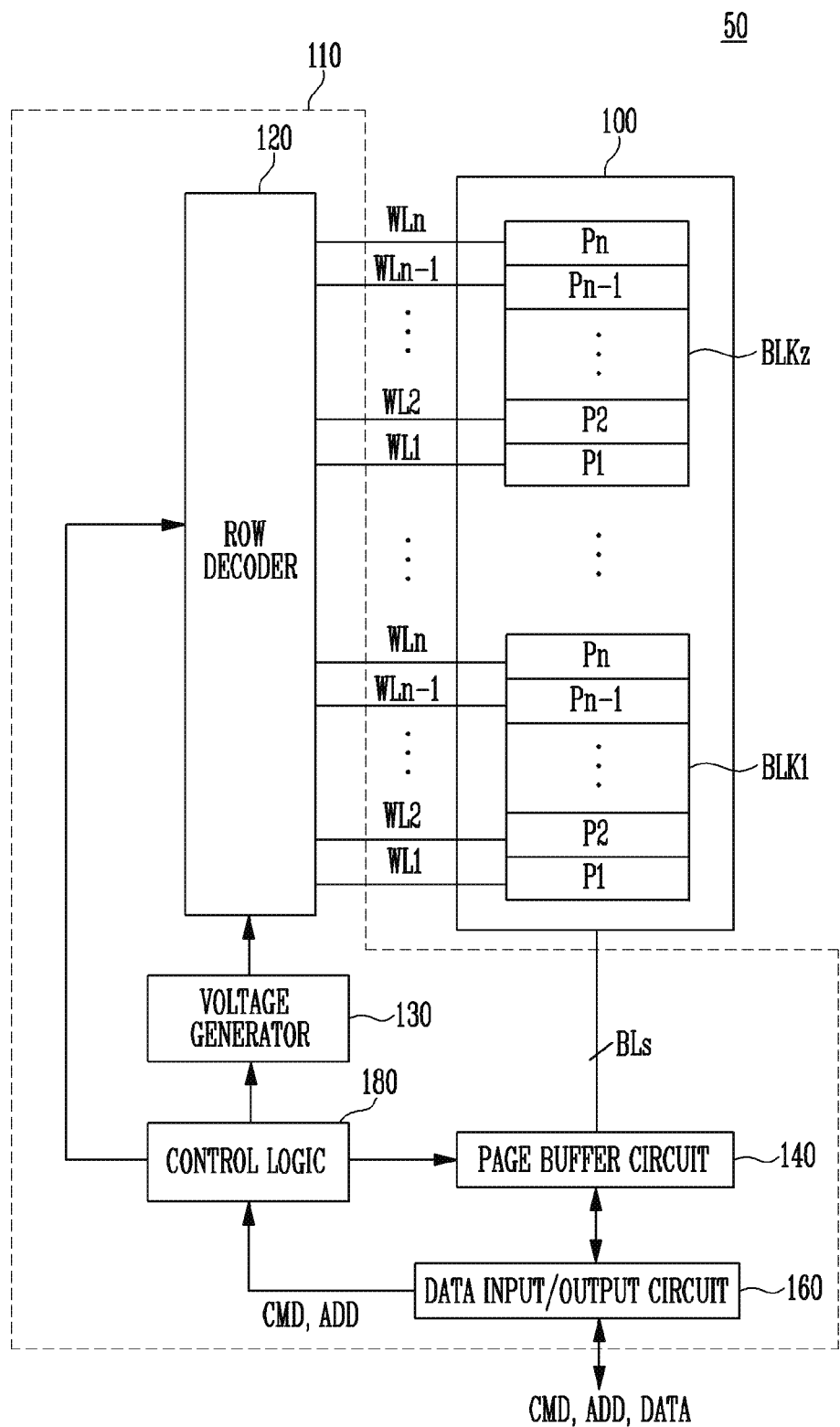
FIG. 3 is a block diagram illustrating a semiconductor memory device shown in FIG. 2.

FIG. 3 is a block diagram of the semiconductor memory device 50 shown in FIG. 2, in accordance with an embodiment.

Referring to FIG. 3, the semiconductor memory device 50 includes a memory cell array 100 and a peripheral circuit 110. The semiconductor device 50 may be a nonvolatile memory device. For example, the semiconductor device 50 may be a flash memory. However, the semiconductor memory device 50, according to an embodiment of the present disclosure, may be applied to another nonvolatile memory device in addition to the flash memory. For example, the nonvolatile memory device may include a Read Only Memory (ROM), a Mask ROM (MROM), a Programmable ROM (PROM), an Erasable Programmable ROM (EPROM), an Electrically Erasable Programmable ROM (EEPROM), a Ferromagnetic ROM (FROM), a Phase change RAM (PRAM), a Magnetic RAM (MRAM), a Resistive RAM (RRAM), a NOR flash memory, and the like.

The peripheral circuit 110 includes a row decoder 120, a voltage generator 130, a page buffer circuit 140, a data input/output circuit 160, and a control logic 180. The control logic 180 may be implemented as hardware, software, or a combination thereof.

The memory cell array 100 includes a plurality of memory blocks BLK1 to BLKz. Each of the memory blocks BLK1 to BLKz is connected to the row decoder 120 through word lines WL1 to WLn. Additionally, each of the memory blocks BLK1 to BLKz is connected to the page buffer circuit 140 through bit lines BLs. Each of the memory blocks BLK1 to BLKz includes a plurality of memory cells divided into a plurality of physical pages P1 to Pn. Each physical page means a set of memory cells connected to one word line. The memory cells may be nonvolatile memory cells. A program operation and a read operation may be performed in units of physical pages, and an erase operation may be performed in units of blocks. Each of the memory cells may store one-bit data or multi-bit data of two bits or more. A memory cell capable of storing one-bit data is defined as a Single Level Cell (SLC), and a memory cell capable of storing multi-bit data is defined as a Multi-Level Cell (MLC). For example, a memory cell for storing three-bit data is referred to as a Triple Level Cell (TLC), and a memory cell for storing four-bit data is referred to as a Quadruple Level Cell (QLC). In the following description, the MLC is divided according to the number of bits stored in one memory cell. For example, the TLC is referred to as a three-bit MLC, and the QLC is referred to as a four-bit MLC.

Bits stored in each of MLCs included in one physical page form a plurality of logical pages. For example, bits stored in a three-bit MLC may form three logical pages, and bits stored in a four-bit MLC may form four logical pages. The logical page may be a data access unit. When a read operation is performed in one physical page, data may be accessed in units of logical pages.

The row decoder 120 may receive a row address from the control logic 180, and may select a memory block and a word line by decoding the received row address. Accordingly, in a program or read operation, a program voltage or read voltage may be provided to a word line of a memory block corresponding to the row address.

The voltage generator 130 may generate voltages necessary for various operations under the control of the control logic 180. For example, the voltage generator 130 may generate various operating voltages, such as a program voltage, a pass voltage, a read voltage, a program verify voltage, an erase voltage, an erase verify voltage, a turn-on voltage, a turn-off voltage, and the like according to an operation code output from the control logic 180. The operating voltages generated by the voltage generator 130 are not limited to the examples listed above.

The operating voltages generated by the voltage generator 130 may be transferred to the word lines WL1 to WLn of the memory block selected by the row decoder 120.

The page buffer circuit 140 may include a page buffer connected to one or more bit lines, and the page buffer may include a plurality of latches. The page buffer circuit 140 may temporarily store data to be programmed in memory cells connected to the selected word line or data read from the selected word line.

The data input/output circuit 160 may transfer data DATA input from the memory controller 40 shown in FIG. 2 to the page buffer circuit 140, or may provide data DATA input from the page buffer circuit 140 to the memory controller 40 shown in FIG. 2.

The control logic 180 may control the voltage generator 130 and the page buffer circuit 140 in response to a command CMD, and may control the row decoder 120 and page buffer circuit 140 in response to an address ADD. Also, the control logic 180 may transmit signals for a next operation to the voltage generator 130 and the page buffer circuit 140 in response to a pass or fail signal.

For example, the control logic 180 may control a program operation, a read operation, and an erase operation of the semiconductor memory device 50 in response to the command CMD.

Figure 4A:
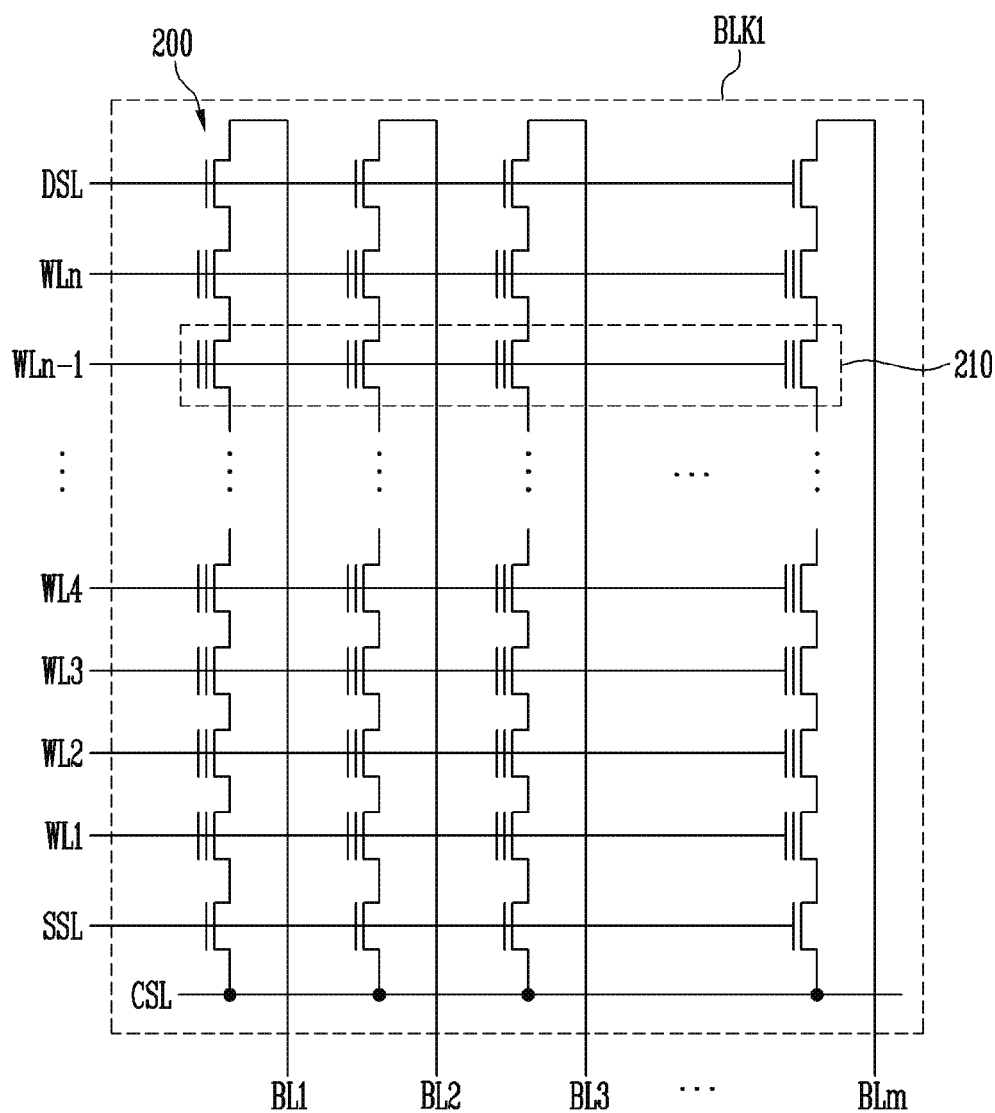
FIGS. 4A and 4B are diagrams illustrating a memory cell array shown in FIG. 3.
Figure 4B:

FIGS. 4A and 4B are diagrams illustrating the memory cell array 100 shown in FIG. 3, in accordance with embodiments of the present disclosure. FIG. 4A is a circuit diagram illustrating the memory block BLK1 shown in FIG. 3, and FIG. 4B illustrates a physical page 210 shown in FIG. 4A.

Referring to FIG. 4A, the memory block BLK1 may include a plurality of cell strings 200. Each of the cell strings 200 includes a drain select transistor connected to a drain select line DSL, memory cells connected to a plurality of word lines WL1 to WLn, and a source select transistor connected to a source select line SSL. The drain select transistor is connected to any one corresponding thereto among bit lines BL1 to BLm, and the source select transistor is connected to a common source line CSL.

A plurality of memory cells included in the plurality of cell strings 200 may be connected to one word line. A set of memory cells commonly connected to any one of the word lines WL1 to WLn is defined as a physical page 210.

Referring to FIG. 4B, one physical page 210 may be divided into a main area A1 for storing main data and a spare area A2 for storing additional data, such as a parity bit.

Data of a plurality of logical pages may be read from the physical page 210.

FIGS. 5A and 5B are diagrams illustrating a page-based reading method. FIGS. 5A and 5B illustrate gray codes defined in a four-bit multi-level cell and a reading method of the four-bit multi-level cell, in accordance with embodiments of the present disclosure. Embodiments of the present disclosure, however, are not limited thereto. For example, the reading method may be used to read data stored in a multi-level cell of two bits or more. The horizontal axis of the graphs shown in FIGS. 5A and 5B indicates threshold voltage Vth of memory cells, and the vertical axis of the graphs shown in FIGS. 5A and 5B indicates number of memory cells.

Referring to FIGS. 5A and 5B, in the case of a four-bit multi-level cell, four bits are programmed in each of memory cells to have various threshold voltage distributions. For example, the four-bit multi-level cell may have one of sixteen different states E and P1 to P15. Gray codes corresponding to the sixteen states E and P1 to P15 may be variously implemented as shown in FIGS. 5A and 5B. The sixteen states E and P1 to P15 may respectively correspond to different threshold voltage distributions.

E among the sixteen states E and P1 to P15 represents an erase state, and P1 to P15 among the sixteen states E and P1 to P15 represent program states. R1 to R15 are different read voltages for reading data stored in the four-bit multi-level cell.

In order to read data stored in the four-bit multi-level cell, each of read operations on first to fourth logical pages Page1 to Page4 may be performed individually. In an example, the read operations on the first to fourth logical pages Page1 to Page4 may be sequentially performed. Embodiments of the present disclosure are not limited thereto, and the read operations on the first to fourth logical pages Page1 to Page4 may be performed in an arbitrary order.

Read voltages allocated to the first to fourth logical pages Page1 to Page4 may be different depending on the gray codes corresponding to the sixteen states E and P1 to P15.

In an example, referring to FIG. 5A, the gray code of the erase state E may be '1111', the gray code of a first program state P1 may be '1110', the gray code of a second program state P2 may be '0110', the gray code of a third program state P3 may be '0111', the gray code of a fourth program state P4 may be '0011; the gray code of a fifth program state P5 may be '0010', the gray code of a sixth program state P6 may be 0000', the gray code of a seventh program state P7 may be '0001', the gray code of an eighth program state P8 may be '0101', the gray code of a ninth program state P9 may be '0100', the gray code of a tenth program state P10 may be '1100', the gray code of an eleventh program state P11 may be '1101', the gray code of a twelfth program state P12 may be '1001', the gray code of a thirteenth program state P13 may be '1000', the gray code of a fourteenth program state P14 may be '1010', and the gray code of a fifteenth program state P15 may be '1011.'

In order to read the first logical page Page1, a second read voltage R2 and a tenth read voltage R10, which constitute a first read voltage set, may be sequentially applied to a selected word line. That is, in order to read the first logical page Page1, a read operation using the second read voltage R2 and a read operation using the tenth read voltage R10 may be sequentially performed.

In order to read the second logical page Page2, a fourth read voltage R4, an eighth read voltage R8, and a twelfth read voltage R12, which constitute a second read voltage set, may be sequentially applied to the selected word line.

In order to read the third logical page Page3, a sixth read voltage R6 and a fourteenth read voltage R14, which constitute a third read voltage set, may be sequentially applied to the selected word line.

In order to read the fourth logical page Page4, a first read voltage R1, a third read voltage R3, a fifth read voltage R5, a seventh read voltage R7, a ninth read voltage R9, an eleventh read voltage R11, a thirteenth read voltage R13, and a fifteenth read voltage R15, which constitute a fourth read voltage set, may be sequentially applied to the selected word line.

In another example, referring to FIG. 5B, the gray code of the erase state E may be '1111', the gray code of the first program state P1 may be '1110', the gray code of the second program state P2 may be '1100', the gray code of the third program state P3 may be '1000', the gray code of the fourth program state P4 may be '0000', the gray code of the fifth program state P5 may be '0100', the gray code of the sixth program state P6 may be '0101', the gray code of the seventh program state P7 may be '0111', the gray code of the eighth program state P8 may be '0110', the gray code of the ninth program state P9 may be '0010', the gray code of the tenth program state P10 may be '1010', the gray code of the eleventh program state P11 may be '1011', the gray code of the twelfth program state P12 may be '0011', the gray code of the thirteenth program state P13 may be '0001', the gray code of the fourteenth program state P14 may be '1001', and the gray code of the fifteenth program state P15 may be '1101.'

In order to read the first logical page Page1, the fourth read voltage R4, the tenth read voltage R10, the twelfth read voltage R12, and the fourteenth read voltage R14, which constitute a first read voltage set, may be sequentially applied to the selected word line.

In order to read the second logical page Page2, the third read voltage R3, the fifth read voltage R5, the ninth read voltage R9, and the fifteenth read voltage R15, which constitute a second read voltage set, may be sequentially applied to the selected word line.

In order to read the third logical page Page3, the second read voltage R2, the seventh read voltage R7, and the thirteenth read voltage R13, which constitute a third read voltage set, may be sequentially applied to the selected word line.

In order to read the fourth logical page Page4, the first read voltage R1, the sixth read voltage R6, and the eleventh read voltage V11, which constitute a fourth read voltage set, may be sequentially applied to the selected word line.

As described with reference to FIGS. 5A and 5B, in order to read data of the multi-level cell, different sensing conditions are provided to the logical pages Page1 to Page 4. For example, in order to read the logical pages Page1 to Page4, different numbers of read operations using read voltages of different levels may be used. For example, as shown in FIG. 5B, four read operations using the fourth read voltage R4, the tenth read voltage R10, the twelfth read voltage R12, and the fourteenth read voltage R14, which are different from each other, are performed so as to read the first logical page Page1. Four read operations using the third read voltage R3, the fifth read voltage R5, the ninth read voltage R9, and the fifteenth read voltage R15, which are different from each other, are performed so as to read the second logical page Page2. Three read operations using the second read voltage R2, the seventh read voltage R7, and thirteenth read voltage R13, which are different from each other, are performed so as to read the third logical page Page3. Four read operations using the first read voltage R1, the sixth read voltage R6, the eighth read voltage R8, and the eleventh read voltage R11, which are different from each other, are performed so as to read the fourth logical page Page4.

As described above, in order to read data of the multi-level cell, when the logical pages Page1 to Page 4 are read by using different numbers of read operations using different read voltages, the logical pages Page1 to Page 4 may be read with different bit error rates, respectively. In an embodiment of the present disclosure, an error is detected and corrected whenever the plurality of read voltages R1 to R15 are applied, so that the error correction efficiency with respect to the same error correction capability can be improved, regardless of differences between numbers of read operations and differences between bit error rates with respect to the logical pages.

Figure 6:
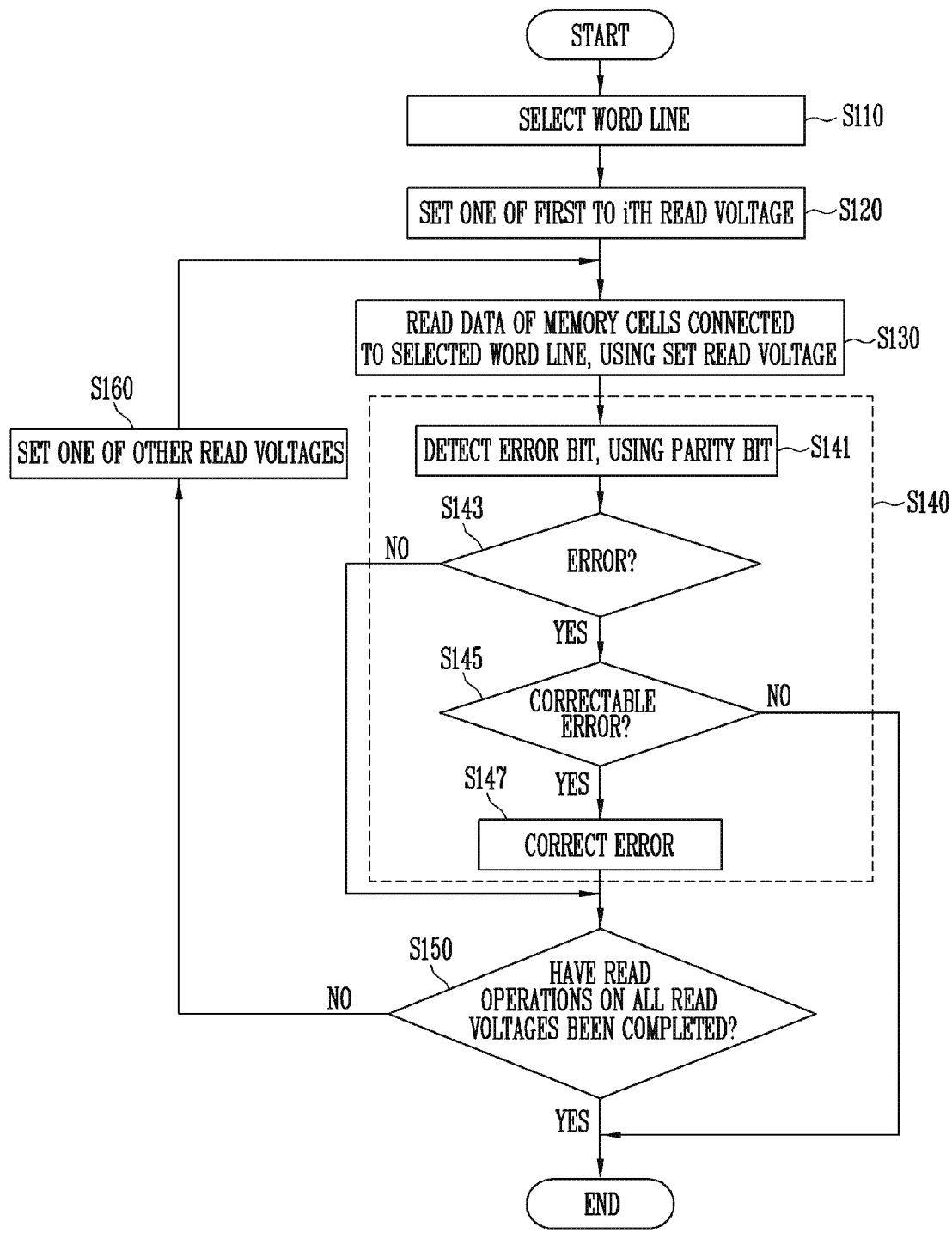

FIGS. 6 and 7 are flowcharts illustrating operating methods of the memory system 30, according to embodiments of the present disclosure.

Referring to FIG. 6, when a read command is provided such that a read operation is started, a word line is selected in step S110.

In step S120, one of first to ith read voltages is set so as to read data from memory cells connected to the selected word line. For example, when data is read from four-bit multi-level cells connected to the selected word line, one of the first to fifteenth read voltages R1 to R15 shown in FIG. 5A or 5B may be set in the step S120.

In step S130, data are read from the memory cells connected to the selected word line using the set read voltage. The read data may be provided to the ECC circuit 60 shown in FIG. 2.

In operation S140, the ECC circuit 60 detects an error of a codeword by reorganizing the read data provided thereto, and corrects the detected error within a correctable range. To this end, the operation S140 may include step S141 of detecting an error bit, using a parity bit, step S143 of checking whether an error has been detected, step S145 of checking whether the detected error bit is within the correctable range, and step S147 of correcting the error bit.

When an error is detected in the step S143 (Yes), it may be determined whether the error bit is correctable.

As the determination result in the step S145, when the detected error is correctable (Yes), an error correction operation is performed in the step S147. Subsequently, in step S150, it may be determined whether read operations on all read voltages have been completed. In the step S150, when the read operations on all the read voltages have not been completed (No), step S160 of setting one of the other read voltages may be performed. Subsequently, the steps S130 to S160 are repeated until the read operations on all the read voltages are completed.

When an error is not detected in the step 143 (No), the step S150 may be performed.

As the determination result in the step S145, when the detected error bit exceeds a correctable threshold value (No), an error of a selected page cannot be corrected. Therefore, an error correction fail signal is generated, and a read operation on the selected page fails.

As described with reference to FIG. 6, in an embodiment of the present disclosure, an error in data read from memory cells can be detected and corrected when a plurality of read voltages are applied. Different read voltages may be applied with respect to logical pages. A read operation performed in units of logical pages is described with reference to FIG. 7.

Referring to FIG. 7, when a read command is provided such that a read operation is started, a word line is selected in step S210.

In step S215, any one of a plurality of logical pages corresponding to data stored in memory cells connected to a selected word line is selected. For example, when data is read from four-bit multi-level cells connected to the selected word line, any one of the first to fourth logical pages Page1 to Page4 shown in FIG. 5A or 5B may be selected in the step S215.

Subsequently, in step S220, one of read voltages allocated to the selected logical page is set. For example, when the first logical page Page1 shown in FIG. 5B is selected, any one of the fourth read voltage R4, the tenth read voltage R10, the twelfth read voltage R12, and the fourteenth read voltage R14, which are allocated to the first logical page Page1, may be set in the step S220.

In step S230, data are read from the memory cells connected to the selected word line, using the set read voltage. The read data may be provided to the ECC circuit shown in FIG. 2.

In step S240, the ECC circuit 60 detects an error of a codeword by reorganizing the read data provided thereto, and corrects the detected error within a correctable range. The step S240 may be performed identically to the operation S140 described with reference to FIG. 6.

After the step S240 is completed, step S250 of determining whether a read operation on the selected logical page has been completed may be performed.

For the determination result in the step S250, when the read operation on the selected logical page is not completed (No), one of the other read voltages on which the read operation has not been performed among the read voltages allocated to the selected logical page may be set in step S255. Subsequently, the steps S230, S240, S250, and S255 may be repeated until the read operation on the selected logical page is completed using a newly set read voltage.

For the determination result in the step S250, when the read operation on the selected logical page is completed (Yes), step S260 of determining whether read operations of all logical pages have been completed may be performed.

For the determination result in the step S260, when the read operations on all the logical pages are not completed (No), step S270 of selecting one of unselected logical pages may be performed. In this manner, the steps S220 to S270 may be repeated until the read operations on all the logical pages are completed.

For the determination result in the step S260, when the read operations on the all the logical pages are completed (Yes), the read operation on the data of the memory cells connected to the selected word line may be ended.

As described with reference to FIG. 7, in an embodiment of the present disclosure, an error of data read from memory cells can be detected and corrected with respect to each of the read operations using read voltages allocated to logical pages. Accordingly, in an embodiment of the present disclosure, the error correction efficiency can be improved regardless of different bit error rates with respect to logical pages divided into different groups depending on numbers of read voltages used in read operations.

Figure 8A:
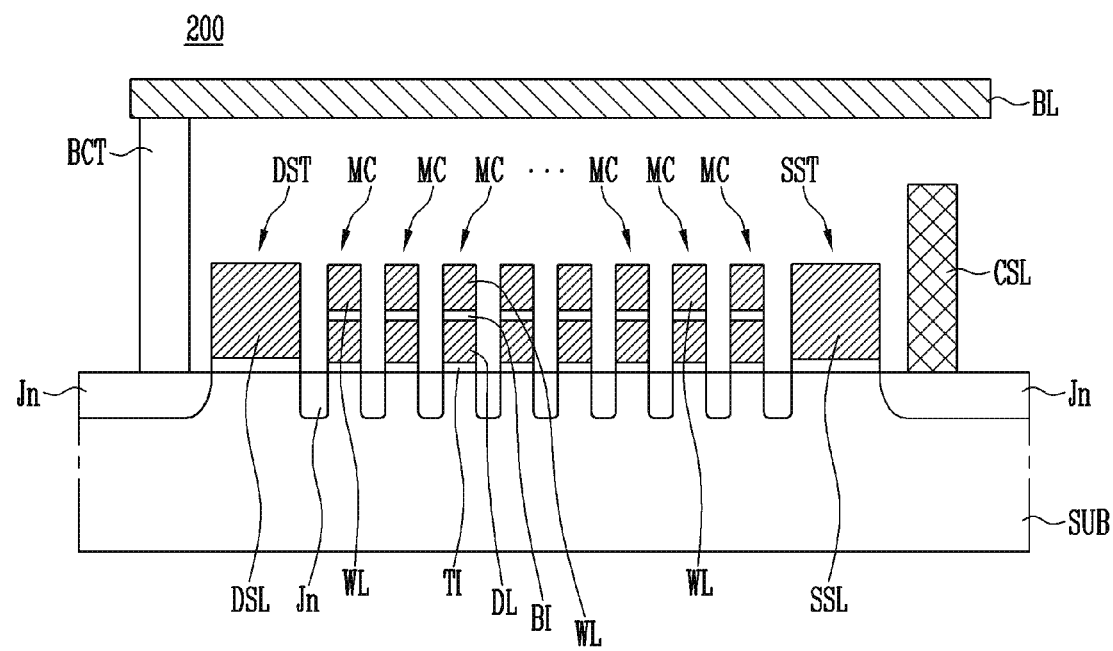
FIGS. 8A to 8C are sectional views illustrating various structures of a cell string shown in FIG. 4A.
Figure 8B:
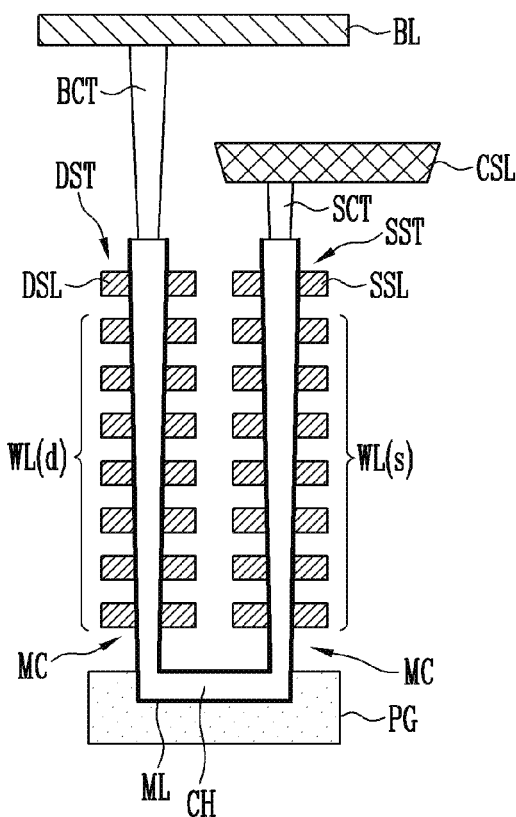
Figure 8C:
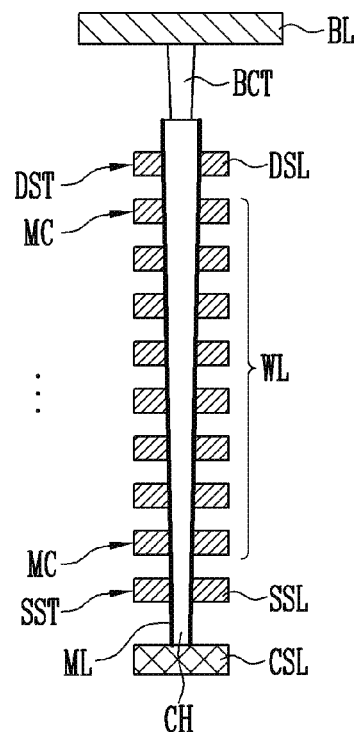

FIGS. 8A to 8C are sectional views illustrating various structures of the cell string 200 shown in FIG. 4A, in accordance with embodiments of the present disclosure.

Referring to FIGS. 8A to 8C, the cell string 200 includes a plurality of memory cells MC, at least one source select transistor SST, and at least one drain select transistor DST, which are connected in series. The source select transistor SST is connected between the plurality of memory cells MC and a common source line CSL. The drain select transistor DST is connected between the plurality of memory cells MC and a bit line BL.

A gate of the source select transistor SST is connected to a source select line SSL, a gate of the drain select transistor DST is connected to a drain select line DSL, and gates of the memory cells MC are connected to word lines WL.

The bit line BL may be connected to the cell string 200 via a bit line contact plug BCT, be connected to the cell string 200 while being in direct contact with a channel layer CH, or be connected to the cell string 200 while being in direct contact with one of junction regions Jn. The common source line CSL may be connected to the cell string 200 via a source contact plug SCT, be connected to the cell string 200 while being in direct contact with the channel layer CH, or be connected to the cell string 200 while being in direct contact with one of the junction regions Jn.

According to an embodiment, the cell string 200 may be formed on an active region of a substrate SUB as shown in FIG. 8A. FIG. 8A illustrates a section of the cell string 200, which is taken along the active region of the substrate SUB. The active region is used as a channel of the cell string 200.

Referring to FIG. 8A, the plurality of memory cells MC, the at least one source select transistor SST, and the at least one drain select transistor DST may be arranged along one direction parallel to a surface of the substrate SUB. Each of the plurality of memory cells MC, the at least one source select transistor SST, and the at least one drain select transistor DST includes junction regions Jn disposed at both sides thereof. The junction regions Jn are defined in the active region of the substrate SUB. The plurality of memory cells MC, the at least one source select transistor SST, and the at least one drain select transistor DST may be connected in series through the junction regions Jn. Each of the junction regions Jn may be a region doped with an n-type impurity.

Each of the memory cells MC is connected to a word line WL. Each of the memory cells MC may include a tunnel insulating layer TI, a data storage layer DL, and a blocking insulating layer BI, which are sequentially stacked between the substrate SUB and the word line WL. The data storage layer DL may be formed with various layers, such as a floating gate layer, a charge trapping layer, and a layer including nano dots. For example, the floating gate layer may be formed of poly-silicon, and the charge trapping layer may be formed of a silicon nitride layer.

One of the junction regions Jn, which is disposed at one side of the drain select transistor DST, may be connected to the bit line contact plug BCT. The bit line BL may be connected to the bit line contact plug BCT. The gate of the drain select transistor DST is connected to the drain select line DSL.

One of the junction regions Jn, which is disposed at one side of the source select transistor SST, may be connected to the common source line CSL. The gate of the source select transistor SST is connected to the source select line SSL.

According to another embodiment, the cell string 200 may be further connected to a pipe gate PG, as shown in FIG. 8B.

Referring to FIG. 8B, the cell string 200 may include memory cells MC of at least two columns, which are stacked on the pipe gate PG. The pipe gate PG may be a region formed by injecting an impurity into a substrate, or be a doped semiconductor layer or conductive layer disposed on the substrate. The cell string 200 may be connected to drain-side gate lines and source-side gate lines, which are stacked on the pipe gate PG to be spaced apart from each other.

The drain-side gate lines may be formed in the same stack structure as the source-side gate lines, and may be spaced apart from the source-side gate lines. The drain-side gate lines may include drain-side word lines WL(d) and a drain select line DSL, which are stacked on the pipe gate PG to be spaced apart from each other. The source-side gate lines may include source-side word lines WL(s) and a source select line SSL, which are stacked on the pipe gate PG to be spaced apart from each other.

The channel layer CH of the cell string 200 may include pillar parts extending to penetrate each of the drain-side gate lines and the source-side gate lines, and a connection part buried in the pipe gate PG to connect the pillar parts. An end portion of one of the pillar parts is connected to the bit line BL, and an end portion of the other of the pillar parts is connected to the common source line CSL. The channel layer CH is used as a channel of the cell string 200.

According to still another embodiment, the cell string 200 may include a channel layer CH connected to the common source line CSL to extend along one direction as shown in FIG. 8C. The common source line CSL may be a region formed by injecting an n-type impurity onto a surface of a semiconductor substrate. Alternatively, the common source line CSL may be a doped semiconductor layer or conductive layer disposed on the substrate.

Referring to FIG. 8C, an upper end of the channel layer CH is connected to the bit line BL, and a lower end of the channel layer CH is connected to the common source line CSL. The cell string 200 is connected to the source select line SSL, the word lines WL, and the drain select line DSL, which are stacked between the common source line CSL and the bit line BL to be spaced apart from each other.

The channel layer CH of the cell string 200 penetrates the source select line SSL, the word lines WL, and the drain select line DSL.

Referring to FIGS. 8B and 8C, each of the cell strings 200 includes a multi-layered memory layer ML surrounding an outer wall of the channel layer CH corresponding thereto. The multi-layered memory layer ML may include a data storage layer in which data can be stored. The multi-layered memory layer ML may further include a tunnel insulating layer disposed between the data storage layer and the channel layer CH. The multi-layered memory layer ML may further include a blocking insulating layer extending along an outer wall of the data storage layer.

The memory cells MC are formed at intersection portions of the word lines WL and the channel layer CH, the source select transistor SST is formed at an intersection portion of the source select line SSL and the channel layer CH, and the drain select transistor DST is formed at an intersection portion of the drain select line DSL and the channel layer CH.

In addition to the structures described with reference to FIGS. 8A to 8C, the cell string 200 may be formed as various other structures in different embodiments.

Figure 9:
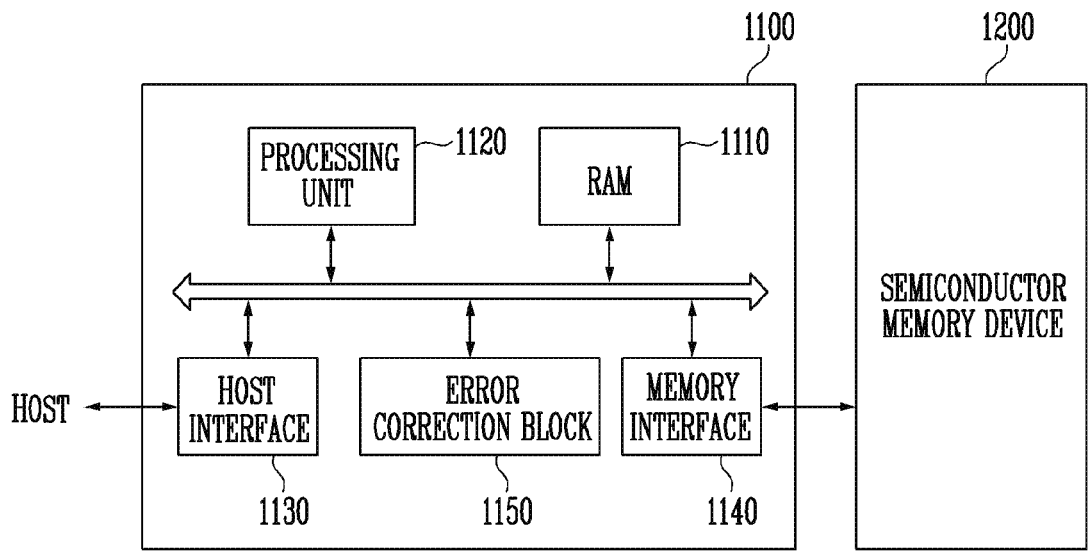
FIGS. 9 and 10 are block diagrams illustrating memory systems, according to various embodiments of the present disclosure.
Figure 10:
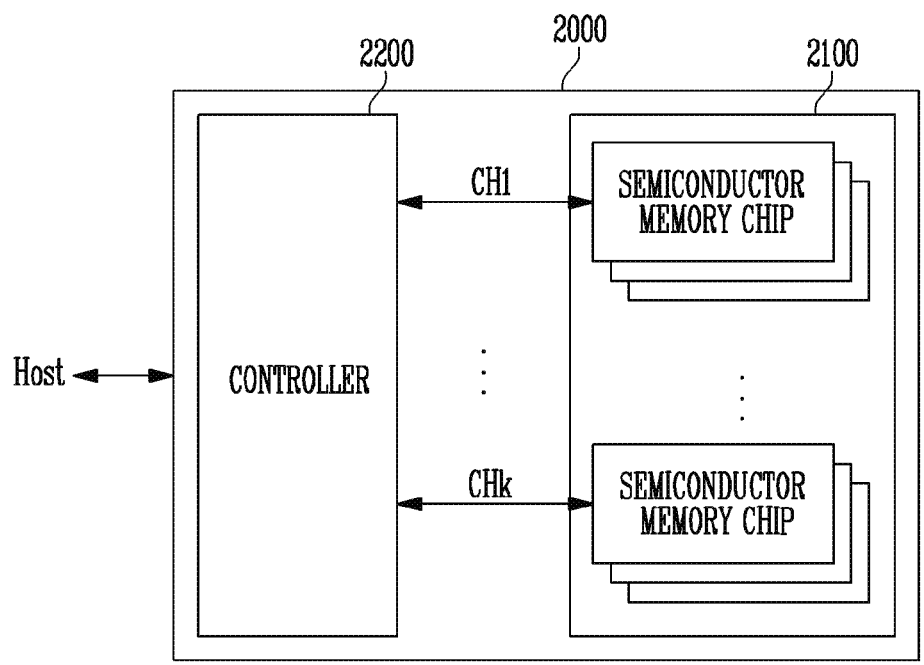

FIGS. 9 and 10 are block diagrams illustrating memory systems according to various embodiments of the present disclosure.

Referring to FIG. 9, a memory system 1000 includes a semiconductor memory device 1200 and a controller 1100. The semiconductor memory device 1200 may be the semiconductor memory device 50 described with reference to FIG. 3. Hereinafter, redundant descriptions are omitted for brevity.

The controller 1100 is connected to a host and the semiconductor memory device 1200. The controller 1100 is configured to access the semiconductor memory device 1200 in response to a request from the host. For example, the controller 1100 controls a read operation, a program operation, an erase operation, an error detection & correction operation, and a background operation of the semiconductor memory device 1200.

The controller 1100 is configured to provide an interface between the semiconductor memory device 1200 and the host. The controller 1100 drives firmware for controlling the semiconductor memory device 1200.

The controller 1100 includes a random access memory (RAM) 1110, a processing unit 1120, a host interface 1130, a memory interface 1140, and an error correction block 1150.

The RAM 1110 is used as at least one of a working memory of the processing unit 1120, a cache memory between the semiconductor memory device 1200 and the host, and a buffer memory between the semiconductor memory device 1200 and the host. The processing unit 1120 controls overall operations of the controller 1100. In addition, the controller 1100 may temporarily store program data provided from the host in a program operation.

The host interface 1130 includes a protocol for exchanging data between the host and the controller 1100. The protocol may be implemented with at least one of the interface protocols described with reference to FIGS. 8A and 8B.

The memory interface 1140 interfaces with the semiconductor memory device 1200. For example, the memory interface 1140 may include a NAND interface or a NOR interface.

The error correction block 1150 detects and corrects an error of data received from the semiconductor memory device 1200 by using an error correction code (ECC). The processing unit 1120 may control the semiconductor memory device 1200 to adjust a read voltage, based on an error detection result of the error correction block 1150, and to perform re-reading. In an embodiment, the error correction block 1150 may be provided as a component of the controller 1100.

The controller 1100 and the semiconductor memory device 1200 may be integrated as one semiconductor device. In an embodiment, the controller 1100 and the semiconductor memory device 1200 may be integrated as one semiconductor device to constitute a memory card. For example, the controller 1100 and the semiconductor memory device 1200 may be integrated into one semiconductor device to constitute a memory card, such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 1200 may be integrated into one semiconductor device to constitute a semiconductor drive, such as a solid state drive (SSD). The semiconductor drive may include a storage device configured to store data in a semiconductor memory. If the memory system 1000 is used as the semiconductor drive, the operating speed of the host connected to the memory system 1000 can be remarkably improved.

As another example, the memory system 1000 may be provided as one of various components of an electronic device, such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 1200 or the memory system 1000 may be packaged in various forms. For example, the semiconductor memory device 1200 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Referring to FIG. 10, a memory system 2000 includes a semiconductor memory device 2100 and a controller 2200. The semiconductor memory device 2100 includes a plurality of semiconductor memory chips. The plurality of semiconductor memory chips are divided into a plurality of groups.

The plurality of groups may communicate with the controller 2200 through first to kth channels CH1 to CHk. Each semiconductor memory chip may be configured and operated identically to the semiconductor memory device 50 described with reference to FIG. 3.

Each group communicates with the controller 2200 through one common channel. The controller 2200 is configured identically to the controller 1100 described with reference to FIG. 9. The controller 2200 controls the plurality of semiconductor memory chips of the semiconductor memory device 2100 through the plurality of channels CH1 to CHk.

Figure 11:
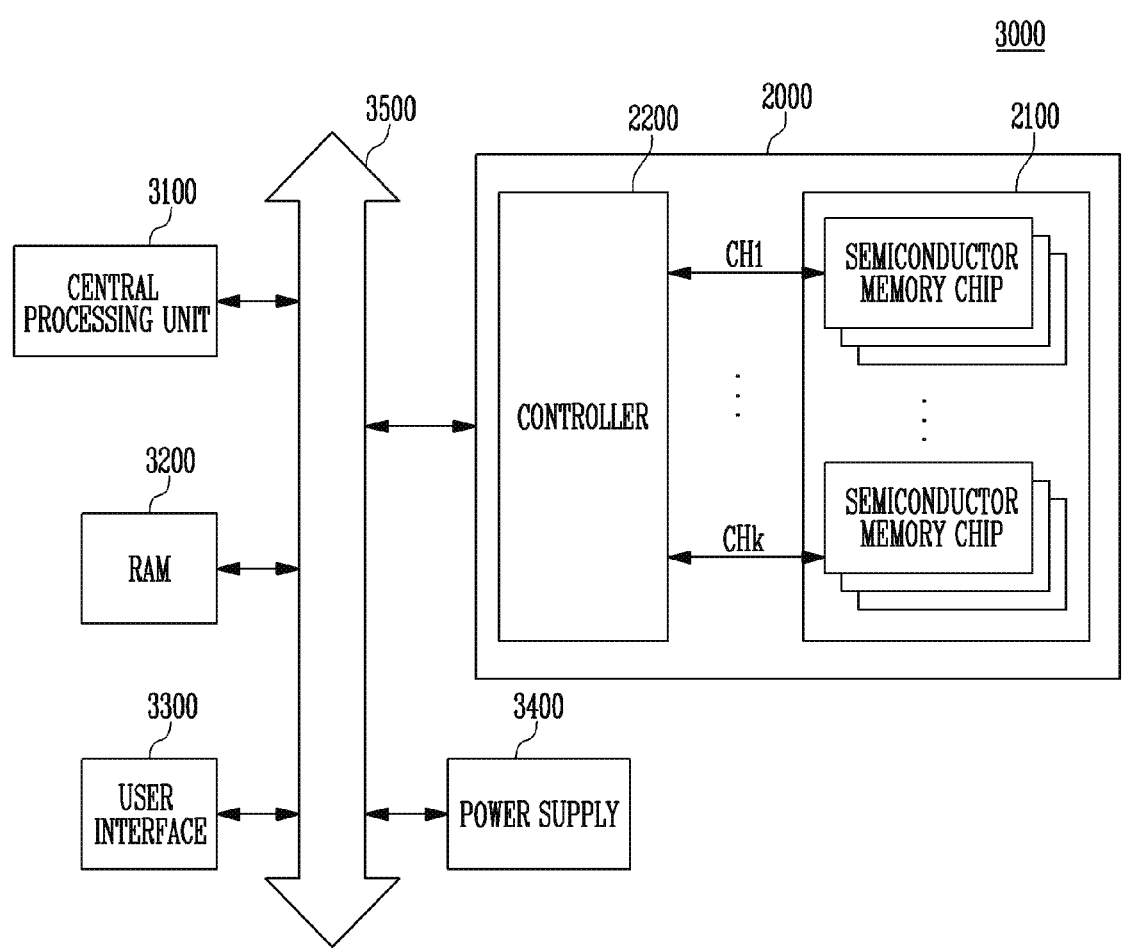
FIG. 11 is a block diagram illustrating a computing system, according to an embodiment of the present disclosure.

FIG. 11 is a block diagram illustrating a computing system 3000, according to an embodiment of the present disclosure.

Referring to FIG. 11, the computing system 3000 includes a central processing unit 3100, a RAM 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

A semiconductor memory device 2100 is connected to the system bus 3500 through a controller 2200. Alternatively, the semiconductor memory device 2100 may be directly connected to the system bus 3500. The function of the controller 2200 may be performed by the central processing unit 3100 and the RAM 3200.

FIG. 11 illustrates the computing system 3000 including the memory system 2000 described with reference to FIG. 10. However, embodiments of the present disclosure are not limited thereto. For example, the memory system 2000 of the computing system 3000 may be replaced with the memory system 1000 described with reference to FIG. 9. In an embodiment, the computing system 3000 may include both the memory systems 1000 and 2000 described with reference to FIGS. 9 and 10, respectively.

According to an embodiment of the present disclosure, an error correction operation is performed whenever read voltages are applied, so that the error correction efficiency can be improved even when numbers of read operations with respect to logical pages are different. Accordingly, the performance of the memory system can be improved.

Embodiments represented in the drawings have been described in the specification. Although specific terminologies are used here, those are only to explain the presented embodiments. Therefore, the present disclosure is not restricted to the above-described embodiments, and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein, including technical or scientific terminologies, have meanings that they are commonly understood to have by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A memory system comprising:
a semiconductor memory device comprising a drain select transistor, a plurality of memory cells, and a source select transistor coupled in series, the drain select transistor being arranged along one direction parallel to a substrate surface on which the plurality of memory cells are formed, the memory device being configured to read data stored in a selected logical page among a plurality of logical pages by applying different read voltages to a selected word line corresponding to the selected logical page; and a controller configured to perform an operation for detecting and correcting an error of the data whenever each of the read voltages is applied to the selected word line, wherein, during a read operation on a logical page, an error in data read from the logical page is both detected and corrected at least twice;

wherein, during the read operation on the logical page, at least two read voltages are sequentially applied to the selected word line, regardless of whether the error is detected; and wherein the at least two read voltages correspond to different program states, respectively.

2. The memory system of claim 1, wherein the semiconductor memory device is configured to read the data by performing logical page read operations respectively corresponding to the logical pages.

3. The memory system of claim 2, wherein at least two of the logical page read operations have different bit error rates.

4. The memory system of claim 2, wherein different read voltage sets are used for performing the logical page read operations for different logical pages.

5. A method for operating a memory system, which comprises a drain select transistor, a plurality of memory cells, and a source select transistor coupled in series, the drain select transistor being arranged along one direction parallel to a substrate surface on which the plurality of memory cells are formed, the method comprising:

selecting one of a plurality of word lines;

performing read operations on the selected word line using a plurality of read voltages; and performing an operation for both detecting and correcting an error in data stored in memory cells connected to the selected word line with respect to each of the read operations at least twice;

wherein, during the operation for both detecting and correcting the error, at least two read voltages are sequentially applied to the selected word line, regardless of whether the error is detected, and wherein the at least two read voltages correspond to different program states, respectively.

6. A method for operating a memory system, which comprises a drain select transistor, a plurality of memory cells, and a source select transistor coupled in series, the drain select transistor being arranged along one direction parallel to a substrate surface on which the plurality of memory cells are formed, the method comprising:

selecting a word line connected to memory cells in which data are stored in a plurality of logical pages;

selecting one of the plurality of logical pages;

performing read operations on the selected logical page using a plurality of read voltages; and performing an operation for both detecting and correcting an error of the data stored in the memory cells for each of the read operations on the selected logical page at least twice;

wherein, during the operation for both detecting and correcting the error, at least two read voltages are sequentially applied to the selected word line, regardless of whether the error is detected, and wherein the at least two read voltages correspond to different program states, respectively.

* * * * *